(12) United States Patent
Mergens et al.

(10) Patent No.: US 7,763,940 B2
(45) Date of Patent: Jul. 27, 2010

(54) DEVICE HAVING A LOW-VOLTAGE TRIGGER ELEMENT

(75) Inventors: Markus Paul Josef Mergens, Munich (DE); Bart Keppens, Gistel (BE); Koen Verhaege, Gistel (BE); John Armer, Middlesex, NJ (US); Cong Son Trinh, Meaux (FR)

(73) Assignee: Sofics BVBA, Gistel (BE)

( * ) Notice: Subject to any disclaimer, the term of this patent is extended or adjusted under 35 U.S.C. 154(b) by 606 days.

(21) Appl. No.: 11/303,054

(22) Filed: Dec. 15, 2005

(65) Prior Publication Data

US 2006/0170054 A1    Aug. 3, 2006

Related U.S. Application Data

(60) Provisional application No. 60/636,135, filed on Dec. 15, 2004.

(51) Int. Cl.
*H01L 23/62* (2006.01)

(52) U.S. Cl. .................. 257/355; 257/157; 257/173; 257/175; 257/356

(58) Field of Classification Search .............. 257/157, 257/175, 173, 355, 356
See application file for complete search history.

(56) References Cited

U.S. PATENT DOCUMENTS

| | | | | |
|---|---|---|---|---|
| 5,290,724 | A * | 3/1994 | Leach | 438/234 |
| 5,561,577 | A * | 10/1996 | Motley | 361/56 |
| 5,629,545 | A * | 5/1997 | Leach | 257/362 |
| 5,903,032 | A * | 5/1999 | Duvvury | 257/356 |
| 6,222,235 | B1 * | 4/2001 | Kojima et al. | 257/355 |
| 6,639,284 | B1 * | 10/2003 | Chatterjee et al. | 257/355 |
| 2001/0036050 | A1 * | 11/2001 | Lee et al. | 361/56 |
| 2002/0154463 | A1 | 10/2002 | Mergens et al. | |
| 2004/0080883 | A1 * | 4/2004 | Chatterjee et al. | 361/56 |
| 2004/0141269 | A1 * | 7/2004 | Kitagawa | 361/56 |
| 2005/0224882 | A1 * | 10/2005 | Chatty et al. | 257/355 |

* cited by examiner

*Primary Examiner*—Victor A Mandala
(74) *Attorney, Agent, or Firm*—Lowenstein Sandler PC (57) ABSTRACT

An electronic device having an LV-well element trigger structure that reduces the effective snapback trigger voltage in MOS drivers or ESD protection devices. A reduced triggering voltage facilitates multi-finger turn-on and thus uniform current flow and/or helps to avoid competitive triggering issues.

26 Claims, 9 Drawing Sheets

FIG. 14

DEVICE HAVING A LOW-VOLTAGE TRIGGER ELEMENT

CROSS-REFERENCE TO RELATED APPLICATIONS

This application claims the benefit of U.S. provisional patent application Ser. No. 60/636,135, filed Dec. 15, 2004, which is incorporated herein by reference in its entirety.

FIELD OF THE INVENTION

The present invention relates to electronic devices such as electrostatic discharge (ESD) protection structures. Specifically, the present invention relates to the use of a low-voltage trigger element having a low voltage well area for implementation of self-protecting high-voltage MOS drivers and ESD protection structures.

BACKGROUND OF THE INVENTION

In order to achieve adequate drive strength and/or ESD protection levels within a MOS-based driver or electrostatic discharge (ESD) protection device, sufficient MOS transistor device width must be provided. Therefore, to create wider structures as well as to meet design rule constraints of pad pitch and maximum active area, devices having multi-finger MOS structures arose in CMOS technologies.

Figure 1:
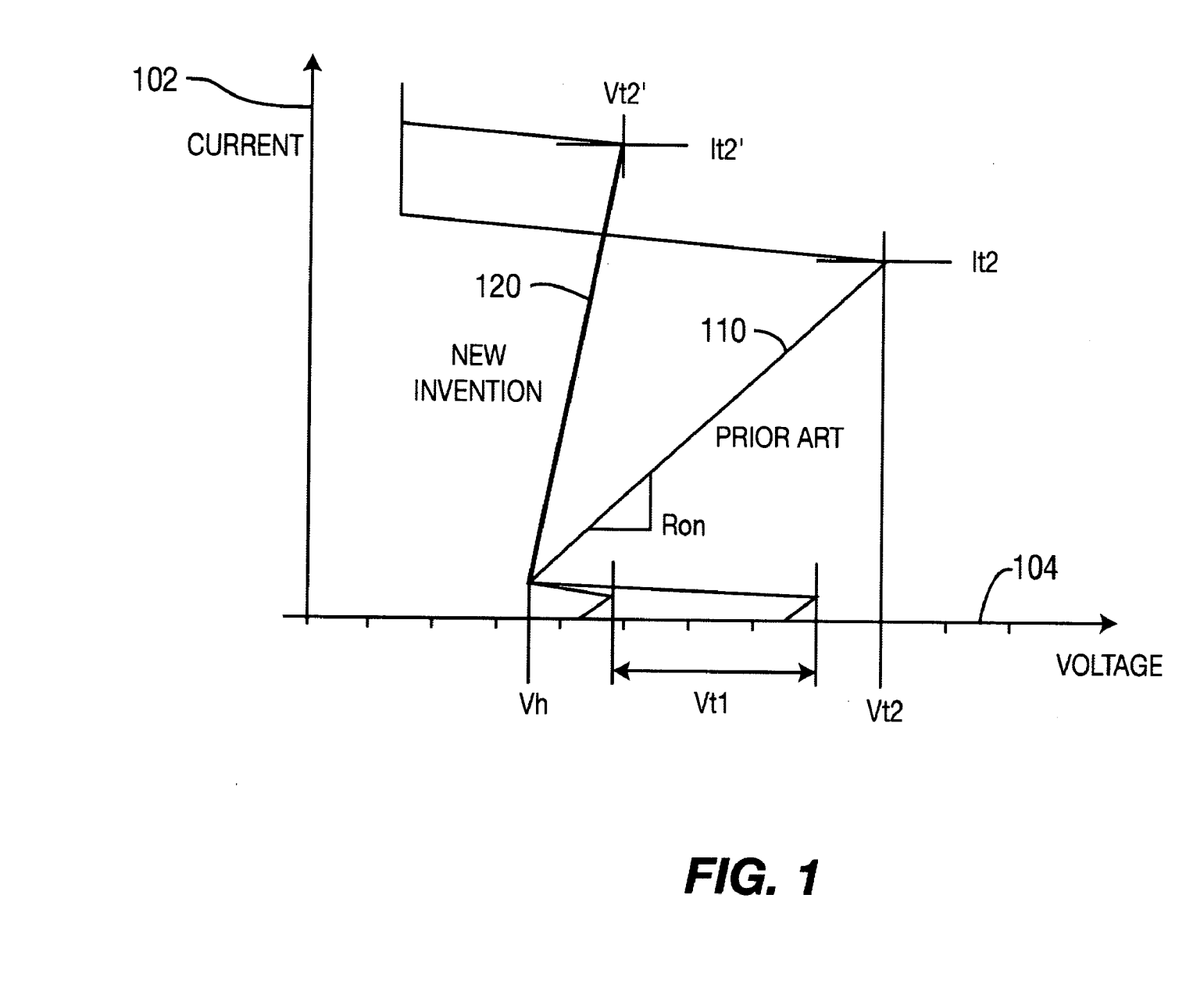
FIG. 1 is a graphical representation illustrating a current/voltage curve for multi-finger devices.

A major concern with regard to multi-finger devices under ESD stress is the possibility of non-uniform triggering and current flow. FIG. 1 is a graphical representation illustrating snapback current/voltage (I/V) curves 110, 120 for triggering multi-finger devices. The graphical representation 100 has an ordinate 102 representing current and an abscissa 104 representing voltage.

The I/V curve 110 represents an I/V curve for a conventional multi-finger device. In order to ensure uniform turn-on of the multi-finger structures, a value at the second breakdown voltage $V_{t2}$ must exceed a first breakdown or triggering voltage $V_{t1}$ of the parasitic bipolar transistor, i.e., the voltage at the onset of snapback. An initially triggered finger can avoid damage due to a too high current load when adjacent parts of the multi-finger device are also activated into low resistive ESD conduction (i.e., snapback). To achieve the well-known "uniformity condition" $V_{t1} < V_{t2}$, either the triggering voltage $V_{t1}$ must be reduced or the second breakdown voltage $V_{t2}$ must be increased or both.

Adding ballasting resistance is a common technique used for increasing $V_{t2}$. Creating an enlarged drain/source contact-to-gate-spacing by applying a silicide-block technique effectively increases the resistive ballasting in each finger. The considerable drawbacks of this common method lies in the significantly increased area of drivers and ESD protection elements on the integrated circuit substrate, as well as a reduced ESD/drive capability and speed due to much higher parasitic drain load capacitance and larger (dynamic) on-resistance.

To reduce the voltage gap between a lowered $V_{t1}$ and $V_{hold}$, gate- and/or bulk-coupling techniques can be applied. The smaller the value of $V_{t1}$, the less susceptible the structure is for non-uniform triggering. Thus, a lower amount of finger ballast resistance is sufficient to achieve the uniformity condition, as well as having numerous advantages such as smaller area, improved drive performance, and enhanced ESD capabilities. The difficulty of this technique is to derive a suitable bias signal from the ESD transient. Ideally, the bias element/circuit should start to operate at or below the holding voltage, such that snapback, and thus the multi-finger triggering issues, are entirely eliminated. Static (e.g., zener trigger) as well as transient (e.g., RC trigger) gate-/bulk-biasing techniques were used in the past to design as close as possible to this target.

A major downside of transient trigger techniques (such as an RC gate-coupling technique), and in particular with regard to RF applications, is the relatively large additional capacitance load that is introduced at the input/output (I/O) pins. Such additional capacitance load drastically deteriorates normal operation speed. In addition, the implementation of proper RC timing circuits for dynamic biasing (on and off) is very difficult, and at times, cannot be achieved within the limits of the target process technology.

The design challenge of static triggering techniques that reduce $V_{t1}$ is finding and harnessing an appropriate breakdown voltage available in advanced technologies (e.g., sub-0.25 micron technology). The doping levels of lightly doped drain (LDD) diffusions in advanced sub-0.25 micron technologies, typically are such that non-leaky zener diodes cannot be realized.

Therefore, there is a need in the art for a method and apparatus for lowering the breakdown voltage $V_{t1}$.

SUMMARY OF THE INVENTION

The present invention provides an area efficient input/output cell or ESD protection device design that maximizes the number of dies per wafer. One embodiment of the invention is an LV-well trigger structure that reduces the effective snapback trigger voltage in MOS drivers or ESD protection devices (e.g., NMOS, SCRs). A reduced triggering voltage facilitates multi-finger turn-on and thus uniform current flow and/or helps to avoid competitive triggering issues.

DETAILED DESCRIPTION

Most CMOS technologies are foreseen to support two or more supply voltages. Consequently, except for different threshold implants, there are often at least two MOS transistor options available, Low Voltage (LV) and High Voltage (HV), differing basically in doping concentration of LDD and diffusions and gate oxide thickness. For LV transistors, thin gate oxides (GOXs) and highly doped LDDs are used, whereas the HV devices are fabricated with a thicker GOX and lower doped LDD implants in order to be able to tolerate higher voltages at junctions and gates.

Figure 2A:
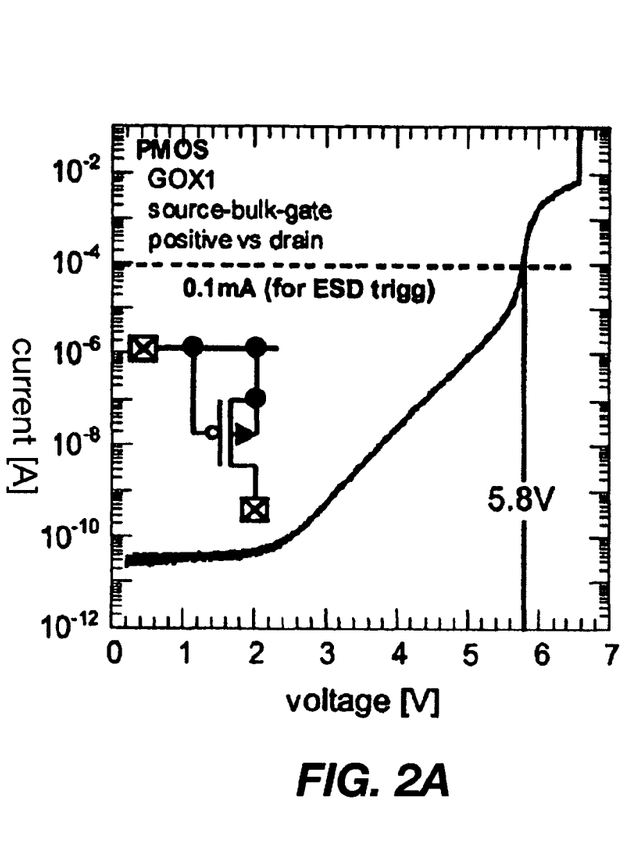
FIGS. 2A and 2B are graphical representations illustrating avalanche breakdown voltage curves for MOS devices.
Figure 2B:
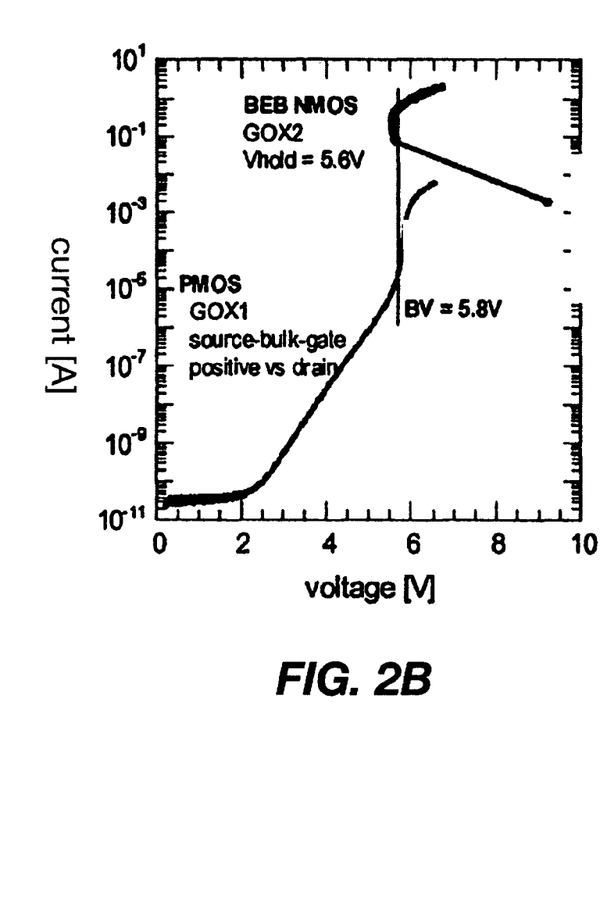

In a number of advanced CMOS technologies, the LV-MOS (thin "GOX1") transistors reveal a drain-bulk (e.g., P+/LV-Nwell) junction breakdown near the holding voltage of a corresponding HV-MOS transistor (thick "GOX2"). This behavior is corroborated in FIGS. 2A and 2B, where the static breakdown characteristic of a 1.8V LV-PMOS is shown (FIG. 2A) and compared to a 3.3V HV-NMOS TLP curve (FIG. 2B) in a CMOS-0.18u technology. FIG. 2B indicates that the LV-PMOS represents an ideal trigger element for the HV-NMOS, since the LV-PMOS breakdown voltage $BV_{LV\text{-}PMOS}=5.8V$ approximately corresponds to the HV-NMOS holding voltage $Vhold_{HV\text{-}NMOS}=5.6V$. The HV-NMOS multi-finger devices are prone to non-uniform triggering and current flow during ESD stress conditions due to the relatively strong snapback (here approximately Vt1-Vhold ~3.5V) as compared to LV-NMOS (only ~2V). This HV-NMOS triggering issue is particularly prominent in low resistive substrate or Epi technologies. Accordingly, a solution for this potential triggering issue would be advantageous to a successful design of a ESD protection device.

The present invention makes use of the breakdown between LV-Wells and elements (e.g., the P+/LV-Nwell as also present in the LV-PMOS), to trigger and control self-protecting, high current HV-driver transistor designs, as well as dedicated ESD protection devices. A low voltage well trigger element is defined as the well area normally associated with a power supply domain lower than those areas containing the devices to be protected. The low voltage well includes other elements, e.g. diffusions that form various LV devices within the LV-well as described above. Together the LV-devices with the LV-well exhibit the desired behavior of a lower breakdown. The term LV-well sometimes can simply mean the area within which low voltage devices are located, the LV-well area being part of the device.

FIG. 1 is a graphical representation of a current/voltage curve for multi-finger devices. As shown in FIG. 1, curve 120 represents the I/V characteristics of the present invention, as compared with the I/V characteristics of the prior art, as shown by curve 110. The LV-Well breakdown lowers the breakdown voltage $V_{t1}$ allowing a lower voltage $V_{t2}$ to $V_{t2}'$ and higher current $I_{t2}'$ through the device.

The following description focuses upon P+/LV-Nwell trigger elements. Equivalent approaches can be applied to N+/LV-Pwell breakdown structures, for example, present in the LV-NMOS transistor. In particular, if an isolated Pwell is present, e.g., in a triple-well (deep-Nwell) technology, implementation can follow exactly the same approach as presented for the LV-Nwell elements.

Figure 3:
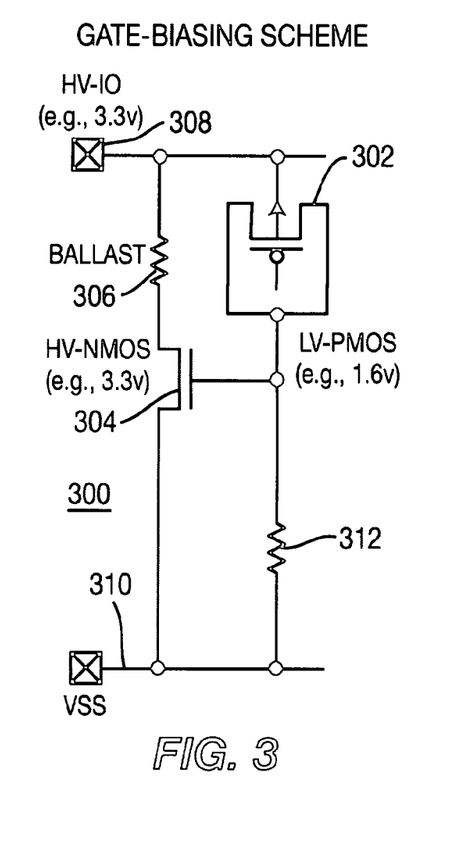
FIG. 3 is a schematic diagram illustrating a gate biasing technique for reducing $V_{t1}$ of a high voltage NMOS device.
Figure 4:
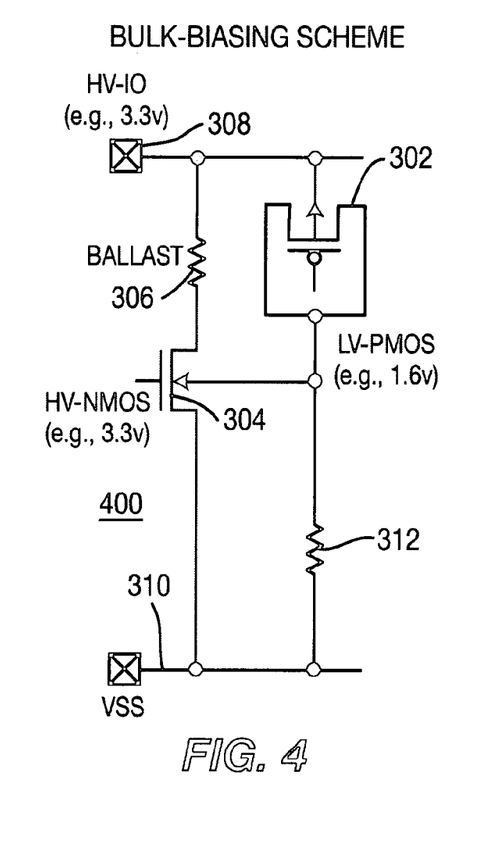
FIG. 4 is a schematic diagram illustrating a bulk biasing technique for reducing $V_{t1}$ of a high voltage NMOS device.

The most straightforward implementation of a P+LV-Nwell trigger element is depicted in FIGS. 3 and 4, where the LV-PMOS is employed as a drain-source-to-LV-Nwell breakdown element, simply leaving the gate of the LV-PMOS trigger floating.

Figure 5:
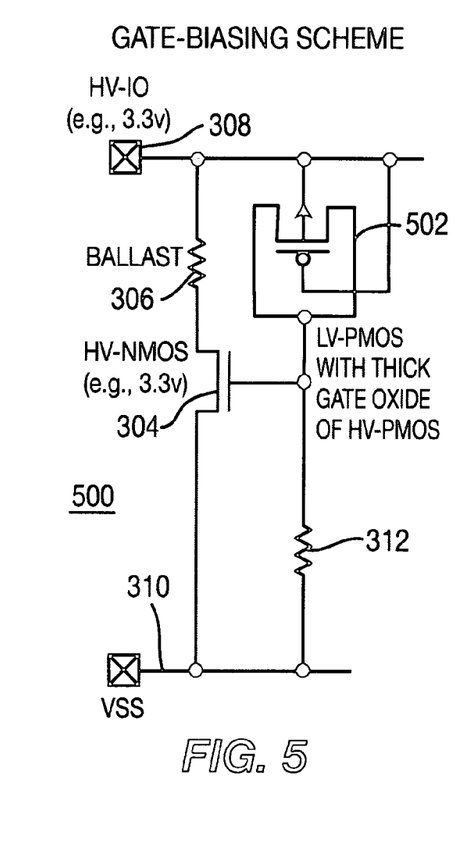
FIG. 5 is a schematic diagram illustrating another gate biasing technique for reducing $V_{t1}$ of a high voltage NMOS device.

FIG. 3 is a schematic diagram illustrating a gate biasing circuit 300 having a LV-PMOS transistor 302 coupled to the gate of an HV-NMOS transistor 304. More specifically, the HV-NMOS transistor 304 is coupled in series with a ballast resistor 306 between an HV-IO pad 308 and a Vss supply lead 310. The LV-PMOS transistor 302 is coupled in series with an element 312 (e.g., a resistor) between the HV-IO pad 308 and the Vss supply lead 310. The element 312 may be resistance or impedance. Alternatively, the element 312 may be a MOS transistor biased to be turned on during normal operation of the circuit and turned off during and ESD event. Alternatively, a MOS transistor could be used that is biased on during both normal operation and ESD events. During normal operation the element 312 is used to bias the controlled node to a low potential, i.e., the gate or bulk of the HV-NMOS in FIG. 3, 4, or 5 is pulled low to maintain the HV-NMOS in an off-state. The junction of the LV-PMOS transistor and the element 312 is coupled to the gate of the HV-NMOS transistor 304. The bulk of the LV-PMOS transistor 302 is coupled to the HV-IO pad 308, the gate is floating and the source and drain regions are coupled to the element 312 and gate of the HV-NMOS transistor 304. An ESD event of the HV-IO pad 308 causes the LV-PMOS transistor 302 to trigger the HV-NMOS transistor 304 such that the ESD event is shunted to the Vss supply lead 310. In this manner, any sensitive circuitry coupled to the HV-IO pad 308 is protected from damage due to the ESD event. Due to sequential supply power-up and hot socket requirements, it is not possible to connect the thin gate to the high voltage supply (HV-VDD), or connect the gate to the low voltage supply. If the gate were connected, as in FIGS. 3 and 4, to either supply, at least for a short period of time (but up to seconds), the thin gate could see the full HV-supply resulting in catastrophic damage.

FIG. 4 is a schematic diagram illustrating a circuit similar to the circuit of FIG. 3, except the LV-PMOS transistor 302 is coupled to the bulk of the HV-NMOS transistor 304 to form a bulk biasing circuit 400. The gate of the HV-NMOS transistor 304 is controlled by the normal, non-ESD circuit functions, for example a pre-driver. As with the LV-PMOS transistor 302 of FIG. 3, the gate of the LV-PMOS transistor 302 remains floating to avoid damage during power up.

Some process technologies offer the option of processing LV junctions in HV-MOS transistors to include a thick gate oxide covering the channel region. This thick oxide is also present in the corresponding HV-PMOS transistor. In this case, as depicted in FIG. 5, the thick gate of the LV-PMOS transistor 502 can be pulled to HV-VDD or any other bias potential within the safe operating range of the thick gate oxide without endangering the gate oxide. More specifically, FIG. 5 depicts a gate biasing circuit 500 that is similar to the circuit 300 in FIG. 3, except that the thick oxide LV-PMOS transistor 502 has its gate connected to the HV-IO pad 308.

If such a thick-GOX LV-PMOS is not an option, in order to avoid a floating thin gate in the trigger LV-PMOS transistor 302, in one embodiment of the invention, a gate control circuit can be introduced. These small circuits (shown in FIG. 6) ensure that the gate bias follows the voltage on the HV-IO pad 308 in order to limit the total voltage drop occurring across the gate and bulk of the LV-PMOS transistor 302. However, the maximum gate voltage level needs to stay below the full voltage at the HV-IO pad 308 (up to HV-VDD) to prevent gate reliability issues to the drain and source side (both basically at ground) of the LV-PMOS transistor 302, respectively.

Figure 6:
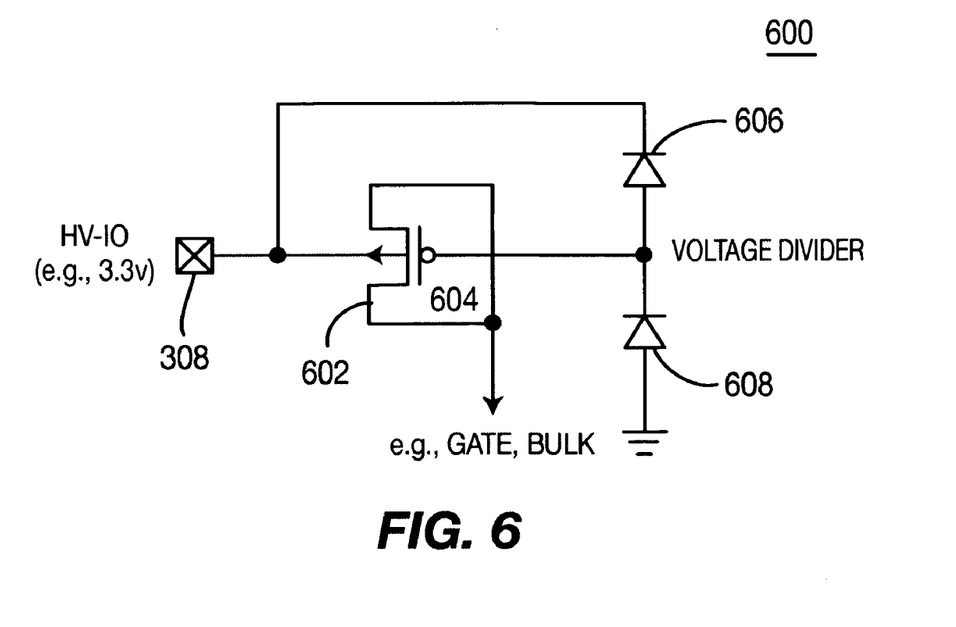
FIG. 6 is a schematic diagram illustrating a gate control circuit of a low-voltage PMOS trigger element.

FIG. 6 is a schematic diagram illustrating a gate control circuit 600 of an LV-PMOS trigger element 602 of the present invention. In this configuration, the gate 604 is indirectly coupled to the HV-IO pad 308 thru a dual-diode voltage divider (diode pair 606, 608). The diode pair 606, 608 is coupled from the HV-IO pad 308 to ground, with the junction between the diode pair 606, 608 connected to the gate 604. The maximum voltage appearing during normal operation at each of the gate-bulk and gate-source/drain regions, respectively, is approximately one-half of the voltage at the HV-IO pad 308, thereby resulting in a safe gate during normal operation of the integrated circuit. The high side of the diode chain can alternatively be tied to the power supply or in the case of hot-socket or fail-safe I/O configuration, the floating well of the special pad circuit that supports hot-socket or fail-safe operation.

Another technique to make use of the beneficial P+/LV-Nwell breakdown of the junction sidewalls, as present in the LV-PMOS transistor under the gate, is eliminating the gate as discussed below. Note that in a P+/LV-Nwell junction of an shallow-trench-isolation (STI) bound diode configuration (conventional design) the avalanche breakdown of this junction occurs at much higher voltage levels as compared to the corresponding PMOS device. This occurs because the junction sidewall (which basically forms the useful junction breakdown) is blocked by the STI region.

Figure 7:
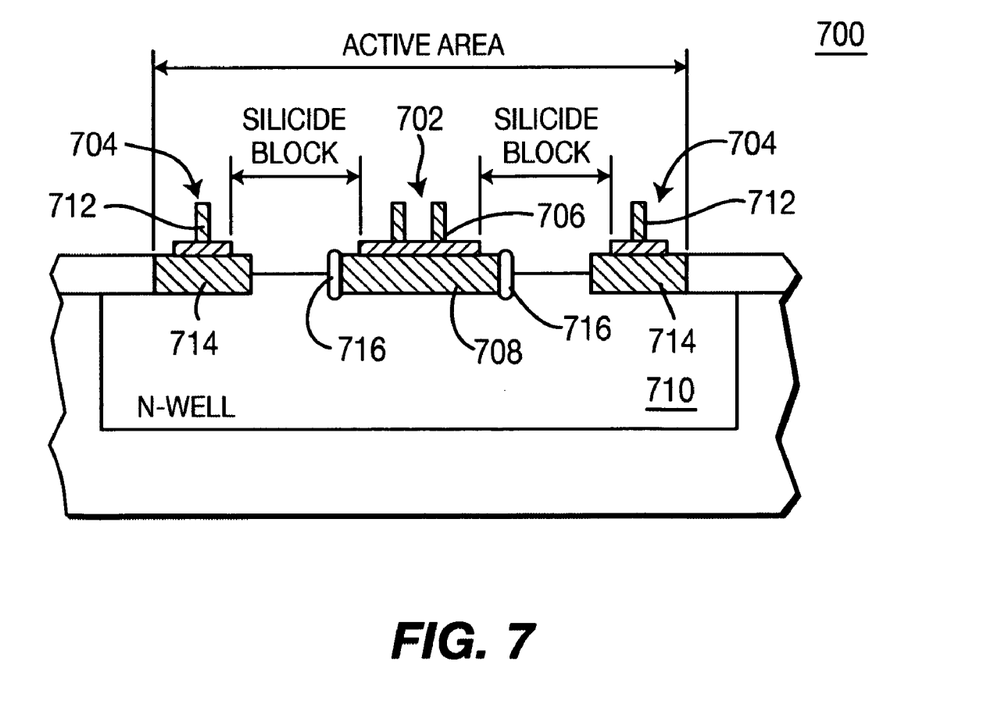
FIG. 7 is a block diagram illustrating a cross-sectional layout of an P+/LV-Nwell structure.

FIG. 7 is a block diagram illustrating a cross-sectional layout of a first embodiment of an P+LV-Nwell structure 700 of the present invention. In order to preserve these sidewall junctions, the STI between anode 702 and cathode 704 is eliminated. The structure 700 (a symmetrical diode) comprises an anode 702 and cathode 704. The anode 702 is defined by a conductive connection 706 to a doped region 708 formed in an N-well 710. The cathode region 704 is an (e.g., annular) region surrounding and spaced from the anode region 708. The cathode region 704 is defined by a conductive connection 712 to a doped region 714 formed in the N-well 710. A suicide block is necessary between the anode and cathode regions 708 and 714 in technologies that normally deposit silicide on active regions Such a device layout can be digitized by a continuous active area drawing the P+ and N+ implants separately. Moreover, it is crucial to block silicide formation between anode 702 and cathode 704 to avoid forming a short across the device. Note that a certain overlap of the silicide-block layout layer on the implant layers is required to avoid having silicide form across the junctions. Disregarding this rule may result in leaky elements due to mechanical stress across the junctions and/or mask misalignments. Such STI-blocked elements are referred herein as "NOSTI" devices.

Figure 8:
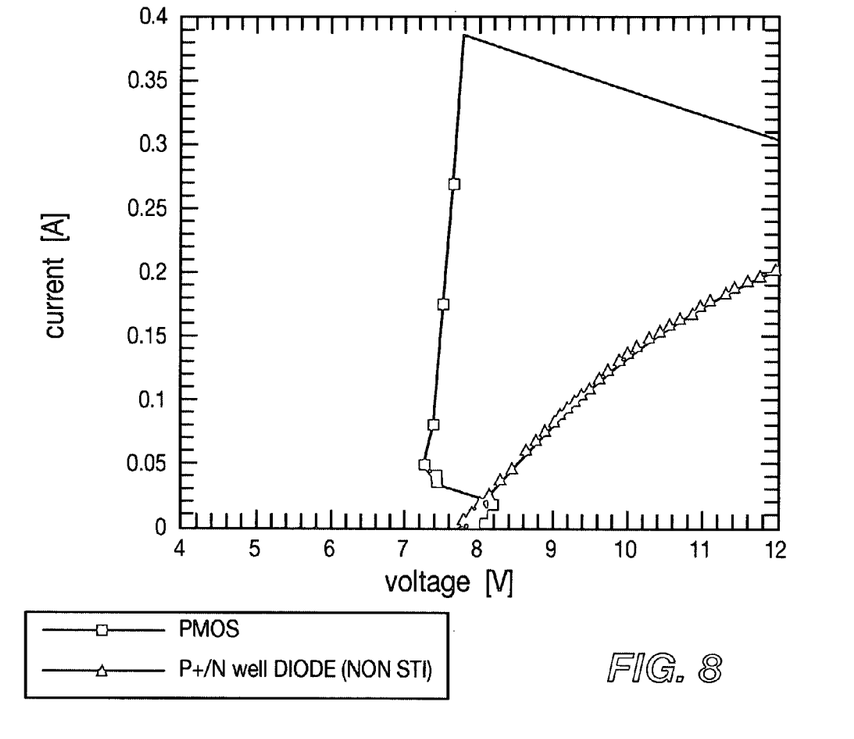
FIG. 8 is a graphical representation illustrating an I/V curve for a PMOS P+/Nwell diode.

The breakdown behavior of such an NOSTI device is shown in FIG. 8. FIG. 8 illustrates a comparison of the reverse I/V curve of a P+/Nwell diode without STI between anode and cathode with conventional PMOS transistor characteristic having the same implants in drain and source. It can be seen from FIG. 8 that a very similar breakdown voltage can be observed in both elements, despite the presence of the gate and resulting different LDD formation due to spacer.

Figure 9:
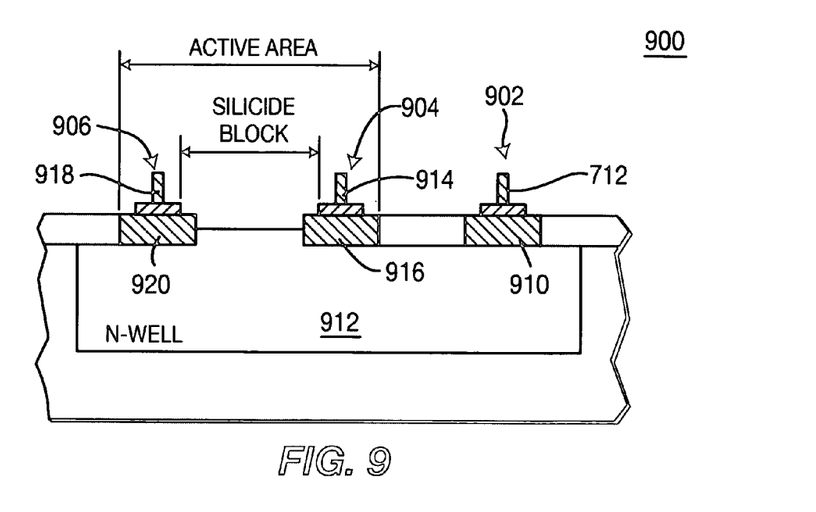
FIG. 9 is a block diagram illustrating a cross-sectional layout of another P+/LV-Nwell structure.

Making use of the parasitic PNP snapback behavior as a trigger mechanism (as indicated by the snapback of the parasitic PNP in the PMOS, FIG. 8), a lateral NOSTI PNP bipolar can be designed, such as shown in the cross-section of FIG. 9. FIG. 9 is a block diagram illustrating a cross-sectional layout of a second embodiment of an P+LV-Nwell structure of the present invention within a lateral PNP transistor 900.

The PNP transistor 900 comprises a base region 902, an emitter region 904 and a collector region 906. The emitter region 904 comprises a connection 914 to a doped region 916, which is formed in the N-well 912. The collector region 906 comprises a connection 918 to a doped region 920, which is formed in the N-well 912. The base region 902 lies between the collector region 906 and the emitter region 904. The collector and emitter regions 904, 906 are not separated by an STI region. The base region 902 comprises a connection 908 to a doped region 910 which is formed in the N-well 912. While the base region 902 is illustrated in the figure as adjacent to the emitter region 904, those skilled in the art will recognize that it may located anywhere within said N-well 912.

Figure 10:
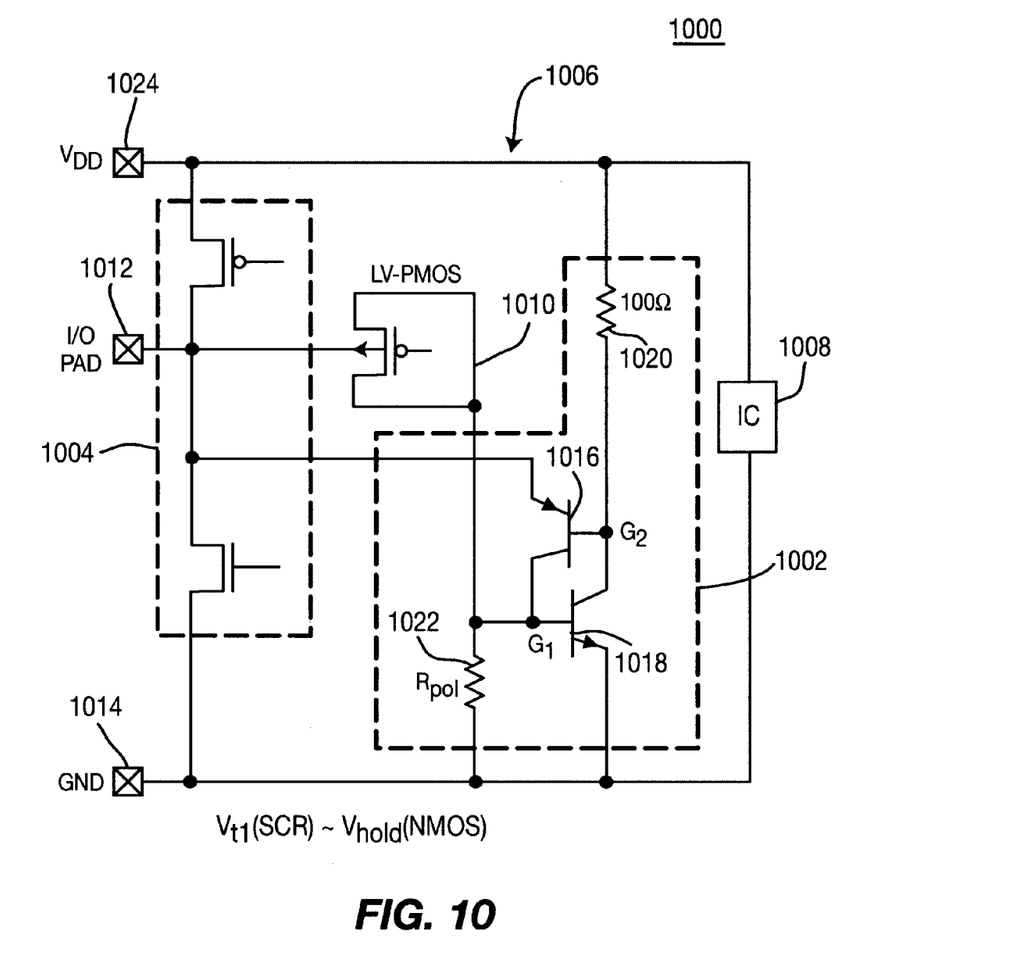
FIG. 10 is a schematic diagram illustrating a P+/LV-Nwell triggered SCR.

The second application of the P+/LV-Nwell structure is an ESD protection element (e.g., SCRs) used to protect driver transistors. FIG. 10 is schematic diagram illustrating an exemplary I/O circuit 1000 having an SCR 1002 as a dedicated ESD protection clamp connected in parallel to an ESD sensitive NMOS driver 1004. The typical design challenge in this type of configuration is the so-called competitive triggering issue, meaning that the protection must turn on before the parallel element (to be protected) reaches damaging current levels. Sufficiently reducing the trigger voltage of the protection device helps to overcome the competitive triggering issue.

FIG. 10 depicts a schematic diagram of a circuit 1000 having a driver 1004, an ESD device 1006, and other circuits 1008 within the integrated circuit. The ESD device 1006 comprises an LV-PMOS transistor (trigger) 1010 and an SCR 1002. The ESD device 1006 is designed to shunt an ESD event from an I/O pad 1012 to ground 1014, and thereby protect the driver circuit 1004 that is connected to the I/O pad 1012. The SCR 1002 comprises a pair of bipolar transistors 1016 and 1018 and two bias resistors 1020 and 1022. The first resistor 1020 is coupled from the SCR gate $G_2$ to the $V_{DD}$ supply 1024, and the second resistor 1022 is connected from the SCR gate $G_1$ to ground 1014. The LV-PMOS trigger 1010 is coupled between the I/O pad 1012 to SCR gate $G_1$. The cathode of the SCR 1002 is connected to ground 1004 and the anode is connected to the I/O pad 1012.

The SCR 1002 is triggered at approximately the holding voltage of the parallel HV-NMOS driver 1004 by applying the P+/LV-Nwell trigger technique for the worst-case stress of a positive ESD pulse to the I/O pad 1012 versus GND. Here, the trigger element 1010 serves as a current injector into the Pwell (gate G1) of the SCR 1002 to latch the device 1000 at low voltage levels. This SCR trigger voltage reduction removes the competitive triggering issue that can arise between the sensitive NMOS driver 1004 and the SCR 1002. This technique allows for area efficient I/O cell designs due to the excellent ESD capabilities of SCR 1002.

Figure 11:
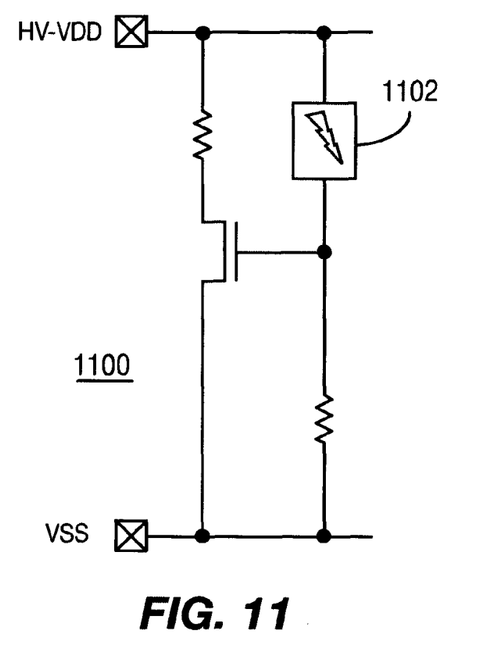
FIGS. 11, 12, 13, and 14 are schematic diagrams illustrating P+/LV-Nwell avalanche breakdown elements used for trigger voltage reduction in power clamps.
Figure 12:
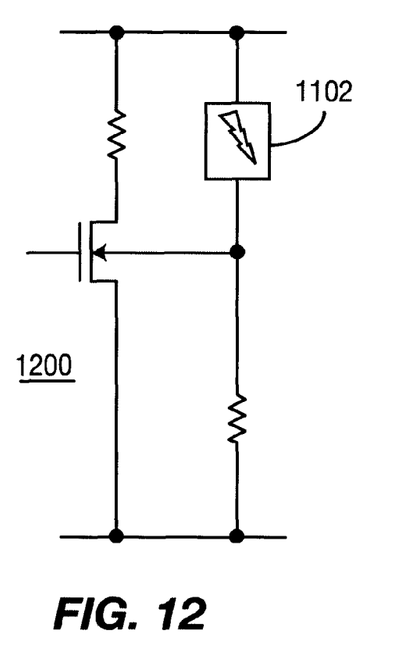
Figure 13:
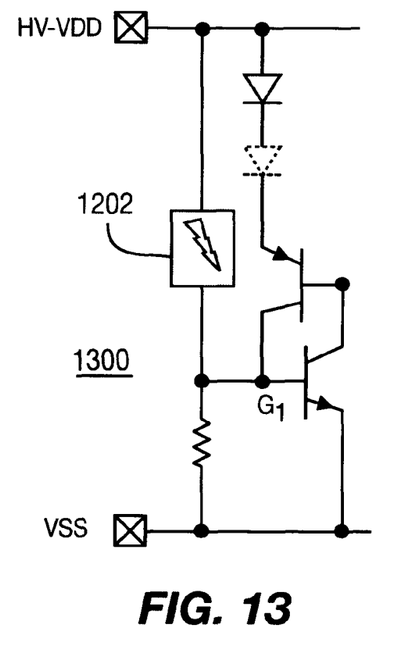
Figure 14:
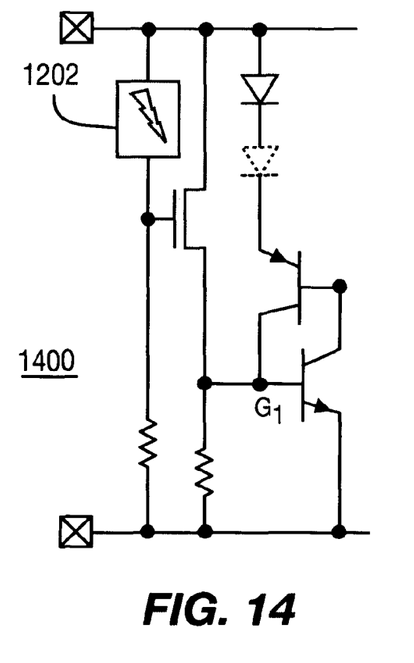

As mentioned above, LV-Well trigger elements can also be applied for SCR-, bipolar and MOS-based power clamps, as demonstrated in FIGS. 11, 12, 13 and 14. FIGS. 11 and 12 are schematic diagrams illustrating an LV-Well trigger element 1102 being used in two NMOS-based power clamps 1100, 1200. An NMOS-based power clamp is illustrative of the type of transistor that can be used. Of course, a PMOS-based power clamp may also be used. FIGS. 13 and 14 are schematic diagrams illustrating an LV-Well trigger element 1202 used in SCR-based power clamps 1300, 1400. FIG. 12 also illustrates bipolar-based clamps in that the MOS Drain, Bulk and Source respectively represent a parasitic NPN Collector, Base and Emitter wherein the trigger circuit controls the Bulk (Base). FIG. 11 can also depict the schematic of an ESD clamp, wherein the HVNMOS (also shown in FIG. 3 as device 304) comprises a MOS device (the so-called "big-FET") that operates in normal MOS (field effect vs. snapback) mode during ESD events and with width large enough to meet specified ESD current sinking requirements when simply in non-snapback MOS mode. A low voltage power clamp bears a number of advantages, such as where I/O ESD stress needs to be dissipated by the power clamp (e.g., in the dual-diode protection approach).

Figure 15:
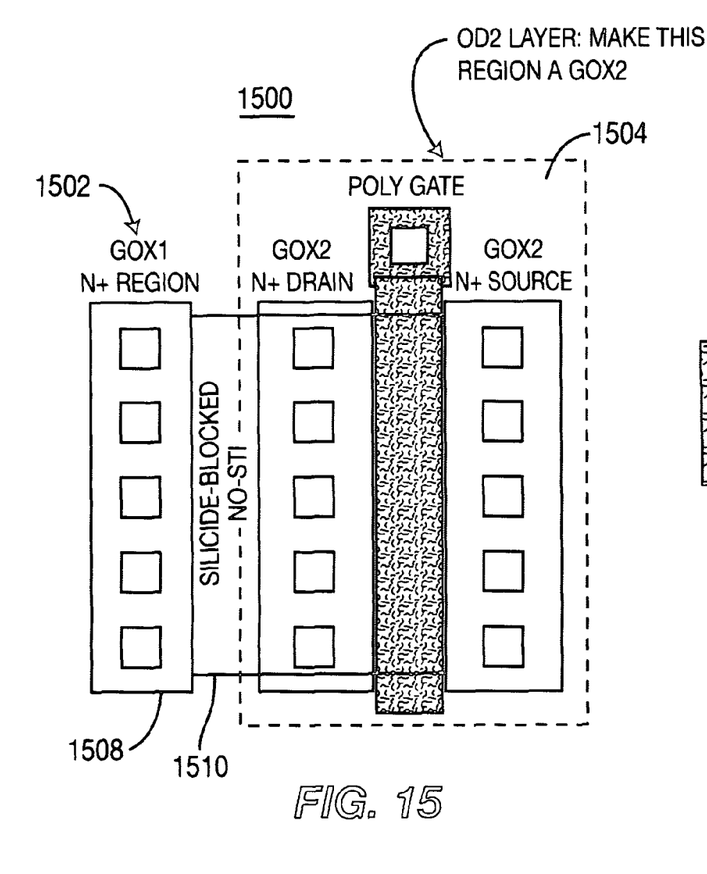
FIGS. 15 and 16 are block diagrams illustrating top and cross-sectional layout views of an LV-Pwell triggered elements integrated into HV-NMOS devices.
Figure 16:
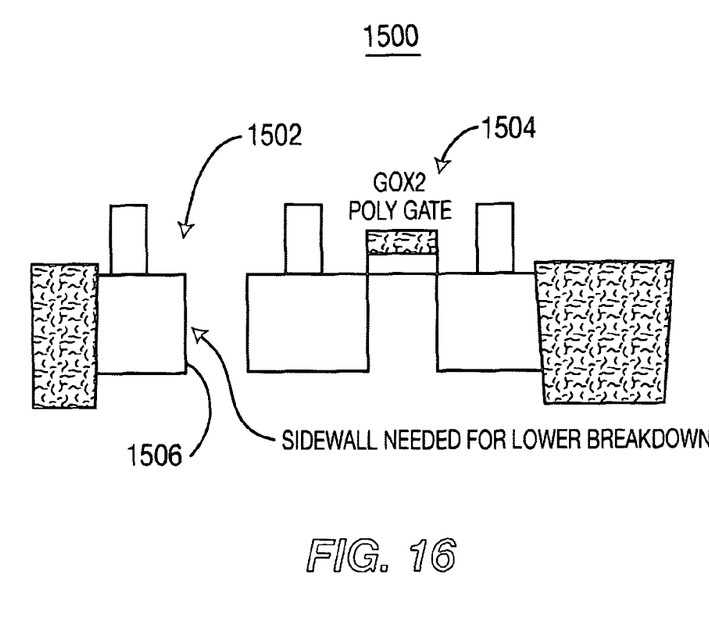
Figure 17:
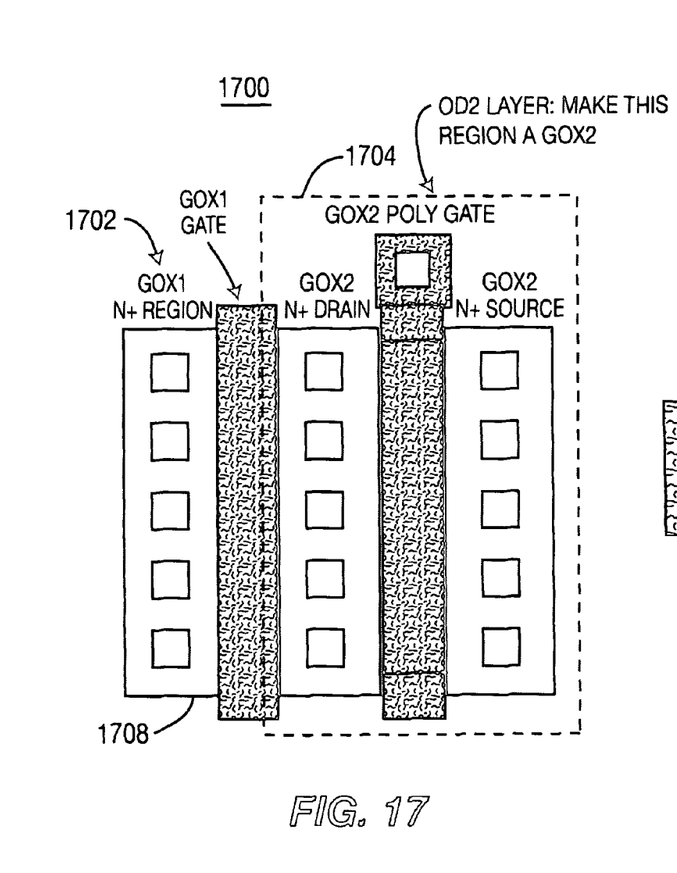
FIGS. 17 and 18 are block diagrams illustrating top and cross-sectional layout views of an LV-Pwell triggered elements integrated into HV-NMOS devices.
Figure 18:
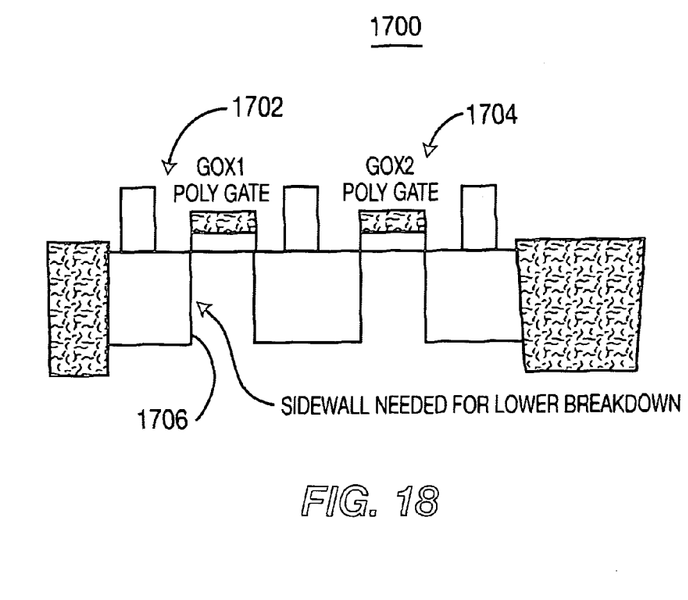

Another way of exploiting the beneficial LV-Well junction breakdown (which defines the low voltage breakdown) is by direct implementation next to the HV-MOS transistor well, as illustratively demonstrated for an HV-NMOS transistor in FIGS. 15 and 16. FIGS. 15 and 16 are block diagrams respectively illustrating top and cross-sectional layout views of a first embodiment of a circuit 1500 having LV-Nwell triggered elements 1502 integrated into HV-NMOS devices 1504. FIGS. 17 and 18 are block diagrams respectively illustrating top and cross-sectional layout views of a second embodiment of a circuit 1700 having LV-Nwell triggered elements 1702 integrated into HV-NMOS devices 1704.

Essential to creating a low trigger voltage is the creation of a side-wall junction (here: N+/LV-Pwell junctions 1506, 1706), which can be achieved in two different ways: 1) spacing the N+-drain in the LV-Well from the HV-drain as defined by OD2 HV-well layer by NOSTI and silicide-block (collectively shown by region 1510) (FIGS. 15 and 16); and 2) spacing the N+-drain in LV-well from the HV-drain by a gate (FIGS. 17 and 18). These example configurations are designed to bias the bulk of the HVNMOS.

Although various embodiments that incorporate the teachings of the present invention have been shown and described in detail herein, those skilled in the art can readily devise many other varied embodiments that still incorporate these teachings.

The invention claimed is:

1. An electronic device comprising:
a triggerable device having at least a first circuit element in a first voltage domain, wherein said triggerable device is coupled from a first pad to a first potential in the first voltage domain;
a trigger device, having at least a second circuit element only of a second voltage domain, coupled to the triggerable device to provide trigger current to turn on the triggerable device, wherein the second voltage domain has a supply voltage lower than the supply voltage of the first voltage domain and said second circuit element is a low voltage element in a low voltage well area, the low voltage well area is a P+/LV-Nwell.

2. The device of claim 1 wherein the triggerable device is an ESD device.

3. The device of claim 1 wherein the triggerable device is a MOS driver.

4. The device of claim 1 wherein the MOS driver is an NMOS transistor.

5. The device of claim 4 wherein the trigger device is an LV-PMOS transistor coupled to a gate of an HV-NMOS transistor, where the LV-PMOS transistor has a floating gate.

6. The device of claim 4 wherein the trigger device is an LV-PMOS transistor coupled to a bulk region of an HV-NMOS transistor, where the LV-PMOS transistor has a floating gate.

7. The device of claim 4 wherein the trigger device is an LV-PMOS transistor coupled to a gate of an HV-NMOS transistor, where the LV-PMOS transistor has a gate coupled to a I/I pad and having a gate oxide with a thickness similar to a thickness of the gate oxide of the HV-NMOS transistor.

8. The device of claim 5 wherein the floating gate is coupled to a gate control circuit.

9. The device of claim 8 wherein the gate control circuit comprises a diode divider.

10. The device of claim 8 wherein the gate control circuit comprises a bias control element for maintaining the trigger device in an off-state during normal operation of a circuit protected by the device.

11. The device of claim 6 wherein the floating gate is coupled to a gate control circuit.

12. The device of claim 1 wherein the gate control circuit comprises a diode divider.

13. The device of claim 11 wherein the gate control circuit comprises a bias control element for maintaining the trigger device in an off-state during normal operation of a circuit protected by the device.

14. The device of claim 1 wherein the trigger device is a diode.

15. The device of claim 1 wherein the trigger device is a bipolar transistor.

16. The device of claim 1 wherein the trigger device comprises an area without a shallow trench isolation.

17. The device of claim 16 having a silicide block.

18. The device of claim 1 wherein the trigger device comprises a sidewall junction.

19. The device of claim 1 wherein the triggerable device is an NPN bipolar device.

20. The device of claim 1 wherein the triggerable device is an SCR.

21. The device of claim 1 wherein the triggerable device is a MOS.

22. The device of claim 1 wherein the triggerable device is a bigFET.

23. The device of claim 1 wherein the triggerable device is a NMOS.

24. The device of claim 1 wherein the triggerable device is a PMOS.

25. The device of claim 1 wherein the triggerable device is a PNP bipolar device.

26. An electronic device comprising:
a triggerable device having at least a first circuit element in a first voltage domain, wherein said triggerable device is coupled from a first pad to a first potential in the first voltage domain;
a trigger device, having at least a second circuit element only of a second voltage domain, coupled to the triggerable device to provide trigger current to turn on the triggerable device, wherein the second voltage domain has a supply voltage lower than the supply voltage of the first voltage domain and said second circuit element is a low voltage element in a low voltage well area, the low voltage well area is a N+/LV-Pwell.

* * * * *